United States Patent [19]
Morcom et al.

[11] 4,184,933
[45] Jan. 22, 1980

[54] METHOD OF FABRICATING TWO LEVEL INTERCONNECTS AND FUSE ON AN IC

[75] Inventors: William R. Morcom, Melbourne Beach; Kenneth A. Berry, Palm Bay, both of Fla.

[73] Assignee: Harris Corporation, Melbourne, Fla.

[21] Appl. No.: 964,570

[22] Filed: Nov. 29, 1978

[51] Int. Cl.² .............................................. C23C 15/00
[52] U.S. Cl. .......................... 204/192 EC; 204/192 E
[58] Field of Search ................... 204/192 E, 192 EC; 156/643

[56] References Cited
U.S. PATENT DOCUMENTS

| | | | |
|---|---|---|---|
| 3,567,508 | 3/1971 | Cox et al. | 117/212 |
| 3,794,517 | 2/1974 | Yperman | 117/217 |
| 3,856,648 | 12/1974 | Fuller et al. | 204/192 |

OTHER PUBLICATIONS

W. H. Legat et al., "Application of Sputtering in the Formation of Semi-conductor Devices", *Solid State Technology*, Dec. 1970, pp. 54–57.

*Primary Examiner*—Aaron Weisstuch
*Attorney, Agent, or Firm*—Leitner, Palan, Martin & Bernstein

[57] ABSTRACT

A method of forming fuses and two level interconnects including applying a layer of fusible material on an insulating layer and through contact apertures, cleaning said fusible layer by sputter etching, applying a layer of metallic material by sputtering, selectively patterning the metallic layer to form a top layer of contacts and interconnects and selectively patterning the fusible layer to form fusible elements and to form a bottom layer of contacts and interconnects.

13 Claims, 4 Drawing Figures

METHOD OF FABRICATING TWO LEVEL INTERCONNECTS AND FUSE ON AN IC

BACKGROUND OF THE INVENTION

1. Field of the Invention

The present invention relates generally to integrated circuits and more specifically to a method of fabricating integrated circuits having fusible elements and interconnects.

2. Description of the Prior Art

The general process of the prior art to form contact areas through an insulation layer onto a substrate includes cleaning the contact area after the aperture is formed. This generally includes degreasing by a suitable solvent followed by the deionized water rinse and a drying step. Unwanted insulating material in the contact area is then removed by, for example, suitable acid etching. This is followed by the application of a metal layer and delineation thereof. The use of the acid as a chemical etch is costly, a possible source of contamination and difficult to perform for wafers of increasing size. As a substitute for cleaning the aperture by chemical etching, sputter etching is becoming common practice in the industry.

Although sputter etching has become standard in the industry, it cannot be used on integrated circuits including thin metal fuses. This is because the sputter etch rate for the insulating material, which is generally silicon dioxide, is slower than the sputter etch rate for the fusible material used in the fuses. Thus, the energy it would take to clear the apertures of residual oxide would completely destroy the desirable properties of the fusible layer if not totally remove the thin film fuse layer itself.

Low energy sputter etching has also become a valuable tool in removing impurities from the surface of a first metal layer so that the second metal layer may make a low resistance contact thereto. However, the use of a low energy sputter etch of the metal layer with the contact apertures exposed also causes redeposit of oxide from the insulation layer into the contact apertures. Another technique for removing impurities of the first metal layer which does not effect the insulation is by applying the second metal layer at a very high temperature. This generally burns off the hydrocarbons or other impurities on the surface of the first metal layer and thus forms a low resistance contact to the second metal layer. By depositing the second metal layer at a high temperature, the crystal structure of the second metal forms hillocks on the second metal layer during sintering. These hillocks could cause undesirable shorts between metallic layers in a two level metal system and undesirable openings in the passivation layer.

Consequently, there exists a need for a process taking advantage of sputter etching in forming an integrated circuit including fusible material and metallic contact metallic layers which allows low resistive contact between the two metallic layers while preventing the formation of hillocks.

SUMMARY OF THE INVENTION

The present invention overcomes the problems of the prior art by providing a process incorporating the sputter etch techniques and applying the second layer of contact material at a low temperature. After the standard formation of devices in an integrated circuit and of contact apertures through an insulating layer on the surface of the substrate, a nonselective high energy sputter etch is performed to clean the contact apertures. Next a thin layer of fusible material is nonselectively applied across the insulating layer and into the contact areas. A low energy sputter etch is then performed to remove impurities from the surface of the fusible layer. A layer of metallic material is then applied over the layer of fusible material nonselectively. The layer of metallic material is applied by a low temperature process, preferably sputtering. The layer of metallic material is then patterned to form an interconnect. Following this the fusible material is selectively patterned to yield the fuse links. The resulting structure includes fusible elements and a two layer contact and interconnect system wherein the layers are coextensive.

OBJECTS OF THE INVENTION

An object of the present invention is to provide a method of fabricating metal interconnects and fusible elements on an integrated circuit using sputter etching techniques to eliminate the cause of hillocks.

Another object is to provide a method of forming a two layer contact and interconnect having low contact resistance while preventing the formation of hillocks.

A further object of the invention is to provide a technique for forming low resistance contact between two layers of contact material wherein the second material is applied at low temperatures.

An even further object is to provide a method of forming an integrated circuit having thin film fuses using a low energy sputter etch in combination with a low temperature contact metal application.

Other objects, advantages, and novel features of the present invention will become apparent from the following detailed description of the invention when considered in conjunction with the accompanying drawings.

DESCRIPTION OF THE PREFERRED EMBODIMENTS

Figure 1:
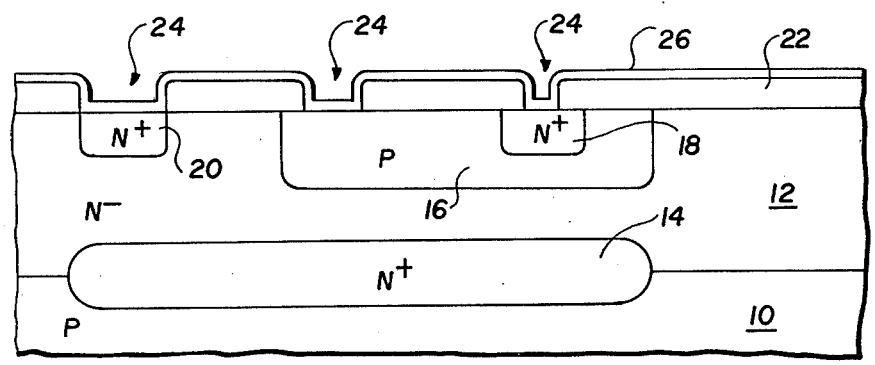
FIGS. 1 through 3 show a cross-section of an integrated circuit illustrating the process embodying the principles of the present invention at differing stages of fabrication.

FIG. 1 illustrates an integrated circuit including a P type substrate 10 and an N− epitaxial layer 12 and a buried N+ layer 14 therebetween. A P base region 16 is formed in the epitaxial layer 12, an N+ emitter region 18 is formed in base region 16, and an N+ collector contact area 20 is formed in the N− epitaxial collector region 12. It should be noted that the transistor illustrated is just one of the many types of devices which may be formed in the integrated circuit and is not to be limited or considered part of the present invention. An insulating layer 22 is formed on the surface of the epitaxial region 12 and contact apertures 24 are formed therein. For example, the substrate 10 may be silicon and the insulating layer 22 may be silicon dioxide. The contact apertures 24 may be formed by standard techniques which include applying a layer of photoresist material, developing the material to form a specific pattern, then etching the photoresist and the underlying region of oxide layer 22. The photoresist layer is then removed. The sequence of process steps which is considered to be the present invention begins at this point.

The contact areas 24 are then sputter etched using an energy of adequate force to clear the apertures of any residual silicon dioxide without other deleterious effects on other parts of the wafer. For silicon dioxide, for example, the energy would be 1500 watts. A thin layer of fusible material 26, for example nichrome, having a thickness of less than 200 angstroms is applied nonselectively over the wafer. This will cover the oxide layer 22 and the contact apertures 24. Preferably, the fusible material layer 26 is applied by sputtering.

Next, the surface of the fusible layer 26 is cleaned by a low energy sputter etch. For a nichrome layer 26 of approximately 0.02 microns thick, a sputter energy of less than 300 watts for a period of four minutes will assure the cleaning of the surface of impurities to allow a low resistance contact between layer 26 and the to-be-applied metallic layer while not deleteriously affecting the nichrome layer 26. A metallic layer 28 is then applied at a low temperature to the clean surface of fusible layer 26. Preferably, silicon doped aluminum is applied using sputtering. By applying metallic layer 28 at low temperature, the crystalline structure of the metal layer 28 will not produce hillocks during subsequent sintering.

By nonselectively applying the fusible layer 26 so as to fill apertures 24, a second cleaning or sputter etching of the contact apertures is not needed before the formation of the contact and interconnect. The prior art generally would delineate the fusible elements before the formation of the contacts to the substrate and thus be prevented from using sputter etching to clean the apertures since it would destroy the fusible element. Thus only liquid etching could be used. The sequence of sputter etching to clean the contact apertures and the nonselective application of the fusible layer followed by the nonselective application of the metallic layer allows the use of the sputter etch to clean the contact apertures which was not previously possible using the prior art sequences. Similarly, the second low energy sputter etch of the surface of the fusible layer allows the low temperature application of the metallic contact and interconnect layer and thus overcomes the problem of hillocks produced by high temperature application of the metallic contact and interconnect layer of the prior art. By applying metallic layer 28 cold or at low temperatures, the layer is more reflective and easier to process through the subsequent photoresist sequence.

Figure 2:
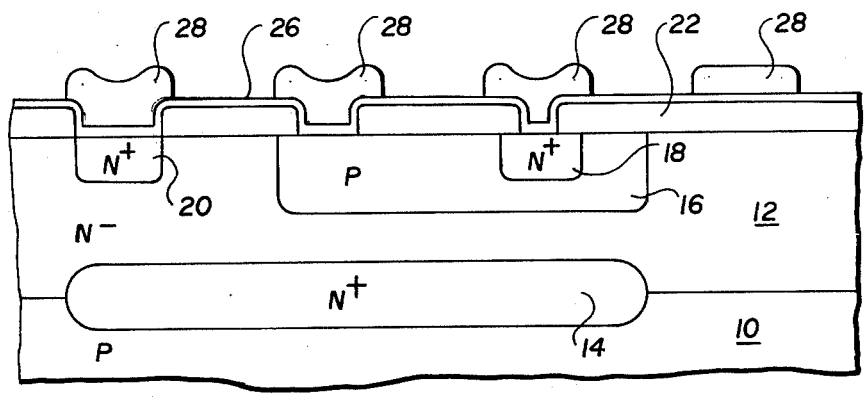

The silicon doped aluminum layer is then subjected to a photresist sequence to define the contacts and interconnects. The photoresist material is applied, developed, and delineated by selectively etching the metallic layer 28 to define the top layer 28 of the contacts and interconnects as illustrated in FIG. 2.

Figure 3:
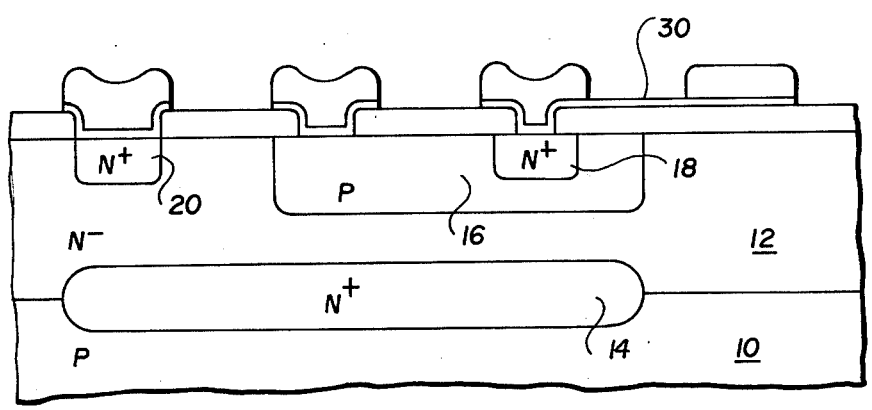
Figure 4:
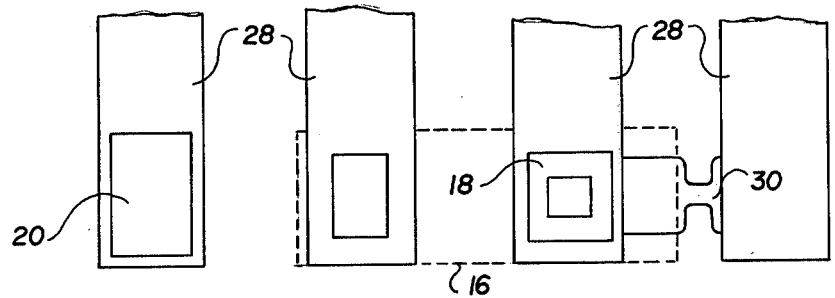
FIG. 4 is a topographical view of the integrated circuit illustrated in FIG. 3 and formed according to the principles of the present invention.

Next, the fusible elements are defined using a photoresist sequence. The resulting structure is illustrated in FIGS. 3 and 4 wherein the fusible element 30 is formed between a pair of interconnects. The contacts and interconnects include a first layer of fusible material 26 and a second coextensive layer of metallic material 28.

The process may then be continued in whatever fashion desired, including possible formation of an overcoat of silox deposition and patterned for passivation purposes. Because of the low temperature application of the metallic layer 28, the worst case condition of hillock formation would find a low density of very small hillocks.

From the preceding description of the preferred embodiment, it is evident that the objects of the invention are attained in that a process is provided wherein sputter etching is used to clean the contact apertures and first level metal in an integrated circuit which includes a fusible element without deleterious effects to the circuit. Although the invention has been described and illustrated in detail, it is to be clearly understood that the same is by way of illustration and example only and is not to be taken by way of limitation. Although nichrome is described as the fusible layer, other materials which may be used as a fusible layer are chrome or platinum silicide. Similarly, silicon doped aluminum has been described as the metallic contact layer and other metals for example, copper doped aluminum or aluminum may be used. The spirit and scope of this invention are to be limited only by the appended claims.

What is claimed:

1. A method of fabricating fuse elements and metallic contacts in an integrated circuit having an insulating layer on a substrate and contact apertures in said insulating layer comprising:
   nonselectively applying a layer of fusible material;
   nonselectively sputter etching said layer of fusible material to clean the surface of said layer of fusible material;
   applying a layer of metallic material at a temperature below the hillock formation threshold of the metallic material;
   selectively removing portions of said layer of metallic material to define a top layer of contacts and interconnects; and
   selectively removing portions of said layer of fusible material to define fuse elements.

2. The method of fabrication according to claim 1 including sputter etching to clean said contact apertures before applying said layer of fusible material.

3. The method of fabrication according to claim 1 wherein said layer of fusible material is chosen from the group consisting of nichrome, platinum silicide, and chrome.

4. The method according to claim 1 wherein said layer of metallic material is chosen from the group consisting of aluminum, silicon doped aluminum, and copper doped aluminum.

5. The method according to claim 1 wherein said sputter etch is performed at an energy level below 400 watts.

6. The method according to claim 1 wherein said layers of fusible and metallic materials are applied by sputtering.

7. The method according to claim 1 wherein said layer of fusible material is nichrome and said layer of metallic material is silicon doped aluminum.

8. The method according to claim 1 wherein both of said removing steps include forming masks on said substrate and etching to remove portions of the appropriate layer.

9. A method of fabricating fuses and metallic contacts for an integrated circuit having an insulating layer thereon and contact apertures in said insulating layer comprising:
   sputter etching said contact apertures;
   applying a layer of fusible material;
   sputter etching said layer of fusible material to clean the surface thereof;

applying a layer of metallic material by sputtering;
selectively removing portions of said layer of metallic material to define a first layer of contacts;
selectively removing portions of said layer of fusible material to define fusible elements.

10. The method according to claim 9 wherein said layer of fusible material is chosen from the group consisting of nichrome and platinum silicide.

11. The method according to claim 9 wherein said layer of metallic material is chosen from the group consisting of aluminum, silicon doped aluminum, and copper doped aluminum.

12. The method according to claim 9 wherein said fusible material is sputter etched at an energy level below 400 watts.

13. The method according to claim 9 wherein said selectively removing said layers of metallic and fusible materials also forms a first and second layer, respectively, of contacts and interconnects.

* * * * *